United States Patent
Baba

(10) Patent No.: US 10,102,970 B2
(45) Date of Patent: Oct. 16, 2018

(54) ELECTRONIC COMPONENT, INDUCTOR CORE MEMBER, AND INDUCTOR

(71) Applicant: KYOCERA Corporation, Kyoto-shi, Kyoto (JP)

(72) Inventor: Hidetoshi Baba, Higashiomi (JP)

(73) Assignee: KYOCERA Corporation, Kyoto-shi, Kyoto (JP)

( * ) Notice: Subject to any disclaimer, the term of this patent is extended or adjusted under 35 U.S.C. 154(b) by 0 days.

(21) Appl. No.: 15/507,172

(22) PCT Filed: Aug. 31, 2015

(86) PCT No.: PCT/JP2015/074676
§ 371 (c)(1),
(2) Date: Feb. 27, 2017

(87) PCT Pub. No.: WO2016/032005
PCT Pub. Date: Mar. 3, 2016

(65) Prior Publication Data
US 2017/0287634 A1    Oct. 5, 2017

(30) Foreign Application Priority Data
Aug. 29, 2014   (JP) ................................. 2014-174941

(51) Int. Cl.
*H01F 27/30*    (2006.01)
*H01F 5/00*     (2006.01)
(Continued)

(52) U.S. Cl.
CPC ......... *H01F 41/06* (2013.01); *H01F 17/0033* (2013.01); *H01F 27/29* (2013.01);
(Continued)

(58) Field of Classification Search
USPC ........... 336/198, 200, 232, 192, 83; 428/646
See application file for complete search history.

(56) References Cited

U.S. PATENT DOCUMENTS 6,515,566 B1 *  2/2003  Toi ........................ H01F 17/045
                                                336/185
8,981,890 B2 *  3/2015  An ............................ H01F 3/14
                                                257/531
(Continued)

FOREIGN PATENT DOCUMENTS

CN    102005297 A    4/2011
JP    2002-280226 A  9/2002
(Continued)

OTHER PUBLICATIONS

International Search Report (Form PCT/ISA/210) issued for PCT/JP2015/074676, dated Nov. 2, 2015.
(Continued)

*Primary Examiner* — Elvin G Enad
*Assistant Examiner* — Kazi Hossain
(74) *Attorney, Agent, or Firm* — Viering Jentschura & Partner MBB

(57) ABSTRACT

An electronic component including a body portion and an electrode disposed on the body portion is provided. The electrode includes a first metal layer, a second metal layer, and a third metal layer. The first metal layer contains silver (Ag) as a main component and includes first dispersion portions containing glass as a main component and second dispersion portions containing nickel as a main component. The second metal layer is disposed on the first metal layer and contains nickel (Ni) as a main component. The third metal layer is disposed on the second metal layer and contains tin (Sn) as a main component. An area of the first dispersion portions is larger than an area of the second dispersion portions in a sectional view of the electrode.

9 Claims, 4 Drawing Sheets

(51) Int. Cl.
*H01F 27/29* (2006.01)
*B32B 15/01* (2006.01)
*H01F 41/06* (2016.01)
*H01L 23/64* (2006.01)
*H01F 17/00* (2006.01)
*H01G 4/40* (2006.01)
*H01G 2/22* (2006.01)
*H03H 7/01* (2006.01)

(52) U.S. Cl.
CPC ............ *H01G 2/22* (2013.01); *H01G 4/40* (2013.01); *H01L 23/645* (2013.01); *H03H 7/175* (2013.01)

(56) References Cited

U.S. PATENT DOCUMENTS

2002/0001712 A1* 1/2002 Higuchi ............... H01G 4/232
                                                            428/336
2004/0140877 A1* 7/2004 Nakao .................... H01F 19/08
                                                            336/200
2009/0296311 A1  12/2009 Otsuka et al.
2011/0051314 A1   3/2011 Sakurai et al.
2015/0243439 A1*  8/2015 Kwag .................... H01G 4/012
                                                            174/260

FOREIGN PATENT DOCUMENTS

JP   2011109065 A    6/2011
KR   1020060045548 A 5/2006
KR   101046499 B1    7/2011

OTHER PUBLICATIONS

Written Opinion (Form PCT/ISA/237) issued for PCT/JP2015/074676, dated Nov. 2, 2015.

* cited by examiner

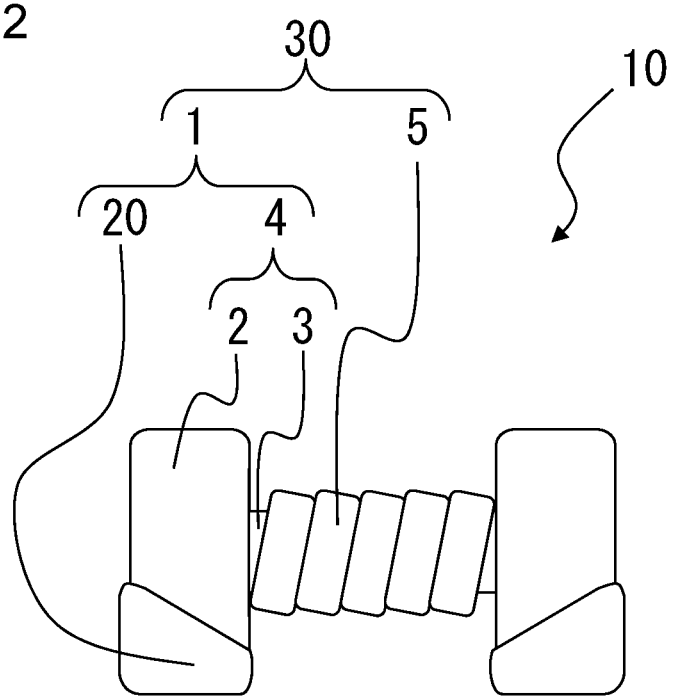

ELECTRONIC COMPONENT, INDUCTOR CORE MEMBER, AND INDUCTOR

TECHNICAL FIELD

The present invention relates to an electronic component, an inductor core member, and an inductor.

BACKGROUND ART

Portable electronic devices, such as smart phones, have various chip electronic components, such as capacitors, chip resistors, and inductors, mounted therein. The electronic devices have been reduced in size and increased in functionality, and the chip electronic components have been reduced in size accordingly. These electronic components are generally mounted on a mounting body, such as a printed wiring board, by bonding electrodes disposed on body portions of the electronic components to conductors disposed on the mounting body by, for example, solder reflow.

An inductor core member according to the related art commonly includes an electrode including a first metal layer containing silver (Ag) as a main component, a second metal layer disposed on the first metal layer and containing nickel (Ni) as a main component, and a third metal layer disposed on the second metal layer and containing tin (Sn) as a main component. An example of an inductor including such an electrode is disclosed in, for example, PTL 1.

CITATION LIST

Patent Literature

PTL 1: Japanese Unexamined Patent Application Publication No. 2002-280226

SUMMARY OF INVENTION

Technical Problem

The inductor according to PTL 1 includes a nickel (Ni) plating layer formed by a barrel plating process as the second metal layer. The electrode formed by the barrel plating process has a relatively low mechanical strength, and is easily separated from a base portion.

Solution to Problem

An electronic component according to the present embodiment includes a body portion and an electrode disposed on the body portion. The electrode includes a first metal layer, a second metal layer, and a third metal layer. The first metal layer contains silver (Ag) as a main component and includes first dispersion portions containing glass as a main component and second dispersion portions containing nickel as a main component. The second metal layer is disposed on the first metal layer and contains nickel (Ni) as a main component. The third metal layer is disposed on the second metal layer and contains tin (Sn) as a main component. An area of the first dispersion portions is larger than an area of the second dispersion portions in a sectional view of the electrode.

An inductor core member according to the present embodiment includes a base portion and an electrode disposed on the base portion. The electrode includes a first metal layer, a second metal layer, and a third metal layer. The first metal layer contains silver (Ag) as a main component and includes first dispersion portions containing glass as a main component and second dispersion portions containing nickel as a main component. The second metal layer is disposed on the first metal layer and contains nickel (Ni) as a main component. The third metal layer is disposed on the second metal layer and contains tin (Sn) as a main component. An area of the first dispersion portions is larger than an area of the second dispersion portions in a sectional view of the electrode.

An inductor according to the present embodiment includes the inductor core member and a wire. In the inductor core member, the base portion includes a winding portion and a leg portion, and the electrode is disposed on a bottom surface of the leg portion. The wire is wound around the winding portion of the inductor core member.

Advantageous Effects of Invention

The electronic component, the inductor core member, and the inductor according to the present embodiment include an electrode that has a relatively high mechanical strength and that is not easily separated from a base portion.

BRIEF DESCRIPTION OF DRAWINGS

FIG. 2 is a side view of an inductor according to an embodiment which includes the inductor core member illustrated in FIG. 1.

DESCRIPTION OF EMBODIMENTS

Figure 1A:
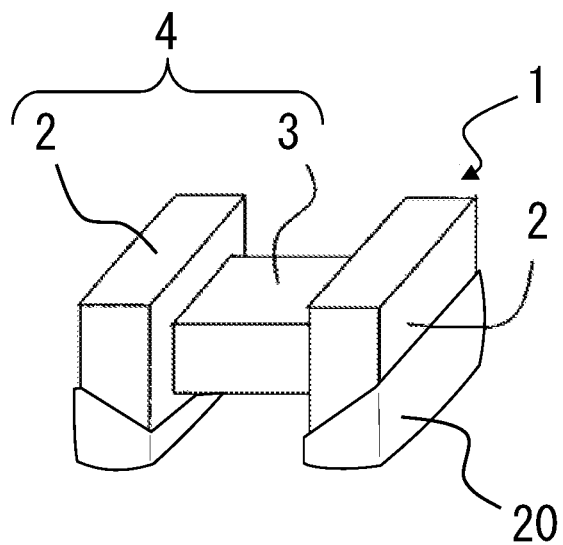
FIG. 1(a) is a perspective view of an inductor core member according to an embodiment.
Figure 1B:
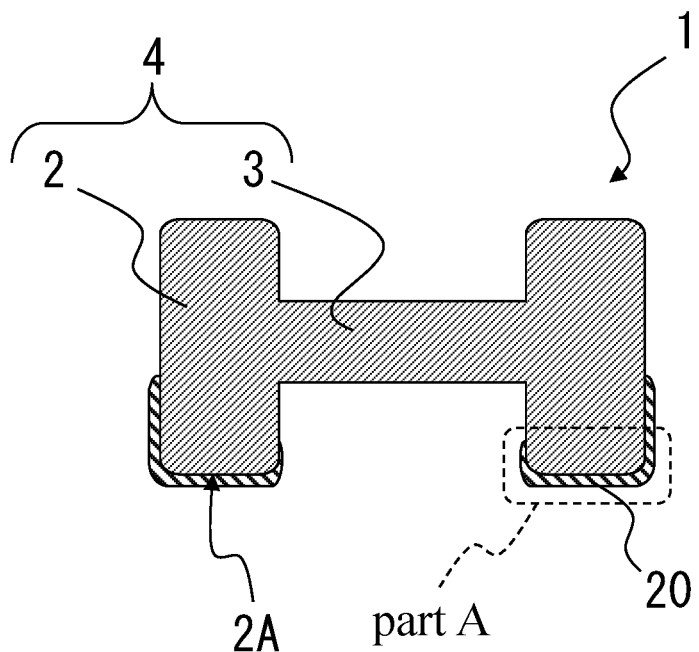
FIG. 1(b) is a sectional view of the inductor core member illustrated in FIG. 1(a).
Figure 3:
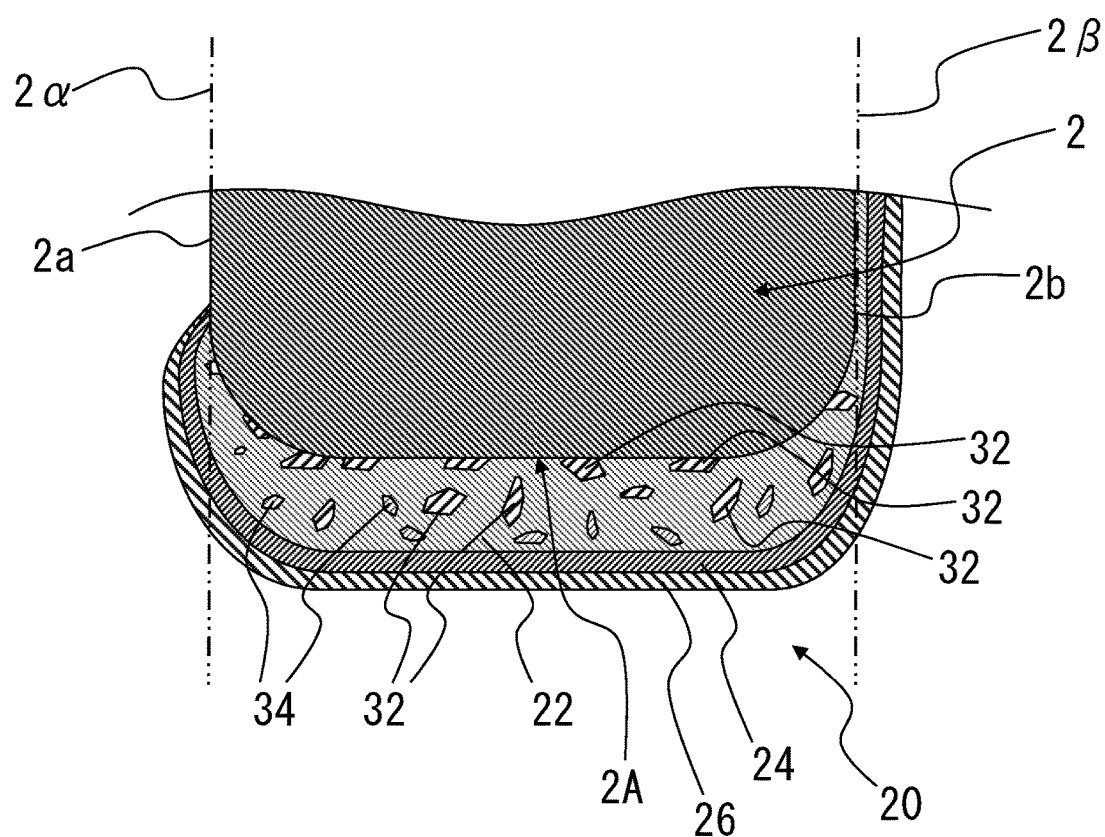
FIG. 3 is an enlarged sectional view of part A in FIG. 1 (b).

An embodiment will be described with reference to the drawings. FIG. 1(a) is a perspective view of an inductor core member according to the present embodiment, and FIG. 1(b) is a sectional view of FIG. 1(a). FIG. 2 is a side view of an electronic component according to the present embodiment, illustrating an inductor including the inductor core member illustrated in FIG. 1 as an embodiment of an electronic component. FIG. 3 is an enlarged sectional view of part A in FIG. 1(b), illustrating a cross section of a part around an electrode of the inductor core member.

The electronic component according to the present embodiment includes a body portion 30 and electrodes 20 disposed on the body portion 30. Each electrode 20 includes a first metal layer 22, a second metal layer 24, and a third metal layer 26. The first metal layer 22 contains silver (Ag) as a main component, and includes first dispersion portions 32 containing glass as a main component and second dispersion portions 34 containing nickel as a main component. The second metal layer 24 is disposed on the first metal layer 22 and contains nickel (Ni) as a main component. The third metal layer 26 is disposed on the second metal layer 24 and contains tin (Sn) as a main component. The area of the first dispersion portions 32 is larger than the area of the second dispersion portions 34 in a sectional view of each electrode 20. The body portion 30 of an inductor 10, which is an embodiment of the electronic component, includes a base portion 4 of an inductor core member 1 and a wire 5. The inductor 10, which serves as the electronic component, is formed by placing the electrodes 20 on the body portion 30.

The inductor core member 1 according to the present embodiment includes the base portion 4 and the electrodes 20 disposed on the base portion 4. Each electrode 20 includes the first metal layer 22, the second metal layer 24, and the third metal layer 26. The first metal layer 22 contains silver (Ag) as a main component and includes the first dispersion portions 32, which contain glass as a main component, and the second dispersion portions 34, which contain nickel as a main component. The second metal layer 24 is disposed on the first metal layer 22 and contains nickel (Ni) as a main component. The third metal layer 26 is disposed on the second metal layer 24 and contains tin (Sn) as a main component. The area of the first dispersion portions 32 is larger than the area of the second dispersion portions 34 in a sectional view of each electrode 20.

The base portion 4 included in the inductor core member 1 includes a winding portion 3 and leg portions 2. The electrodes 20 are disposed on bottom surfaces 2A of the leg portions 2. The inductor core member 1 according to the present embodiment has, for example, an overall length of about 0.5 mm to 1.0 mm in a long-side direction and a length of about 0.4 mm to 0.5 mm in a short-side direction that is perpendicular to the long-side direction. The area of each bottom surface 2A is about 0.048 mm$^2$ to 0.105 mm$^2$, which is considerably smaller than that in the related art. In each electrode 20, the thickness of the first metal layer 22 is, for example, 10 μm to 30 μm, the thickness of the second metal layer 24 is, for example, 1 μm to 10 μm, and the thickness of the third metal layer 26 is, for example, 2 μm to 10 μm.

The inductor 10 according to the present embodiment includes the inductor core member 1 and the wire 5 wound around the winding portion 3 of the inductor core member 1. The base portion 4 is preferably made of a ceramic, such as alumina or ferrite. The winding portion 3 is integrated with the leg portions 2.

In the electronic component (inductor 10) and the inductor core member 1 according to the present embodiment, the area of the first dispersion portions 32 is larger than the area of the second dispersion portions 34 in a sectional view. Here, the sectional view is taken along a plane perpendicular to each bottom surface 2A (sectional view in FIG. 3). In this sectional view, the area of the second metal layer 24, the area of the first dispersion portions 32, and the area of the second dispersion portions 34 are the areas in a region between cross section lines 2α and 2β of an inner imaginary plane and an outer imaginary plane, respectively. The inner and outer imaginary planes are obtained by extending an inner side surface 2a and an outer side surface 2b of the leg portion 2 that intersect the bottom surface 2A. The distance between the cross section lines 2α and 2β of the inductor core member 1 according to the present embodiment, that is, the length of the leg portion 2 in the long-side direction of the inductor core member 1 is, for example, about 0.12 mm to 0.21 mm.

The magnitude relationship between the areas in the sectional view can be determined by, for example, observing the cross section of the inductor core member 1 with a scanning electron microscope. JSM-7001F manufactured by JEOL Ltd., for example, may be used as the scanning electron microscope. The main components of the first metal layer 22, the second metal layer 24, the third metal layer 26, the first dispersion portions 32, and the second dispersion portions 34 may be determined through, for example, electron microanalysis (EPMA, EDS) by using JED-2300 manufactured by JEOL Ltd., which is available together with the scanning electron microscope. In this description, the main component is a component whose content is 50 mass % or more.

In the electronic component (inductor 10) and the inductor core member 1 according to the present embodiment, the area of the first dispersion portions 32 is larger than the area of the second dispersion portions 34 in the sectional view. The area of the first dispersion portions 32 is the total area of the first dispersion portions 32 that are dispersed in the region between the cross section lines 2α and 2β in the sectional view. The area of the second dispersion portions 34 is the total area of the second dispersion portions 34 that are dispersed in the region between the cross section lines 2α and 2β in the sectional view.

In the inductor 10, a relatively large amount of granular first dispersion portions 32 containing glass as a main component is dispersed in the first metal layer 22 containing silver as a main component. Glass has a Young's modulus of about 40 ($\times 10^9$ N/m$^2$), which is lower than the Young's modulus of silver, which is about 76 ($\times 10^9$ N/m$^2$). Glass (first dispersion portions 32) is more easily deformed under external stress than silver. Since the first metal layer 22 contains a relatively large amount of first dispersion portions 32 containing glass as a main component, even when an external force is applied to the first metal layer 22, the first metal layer 22 is easily deformed and absorbs the external force. Therefore, the first metal layer 22 is not easily damaged, for example, cracked, by an external force.

Figure 4:
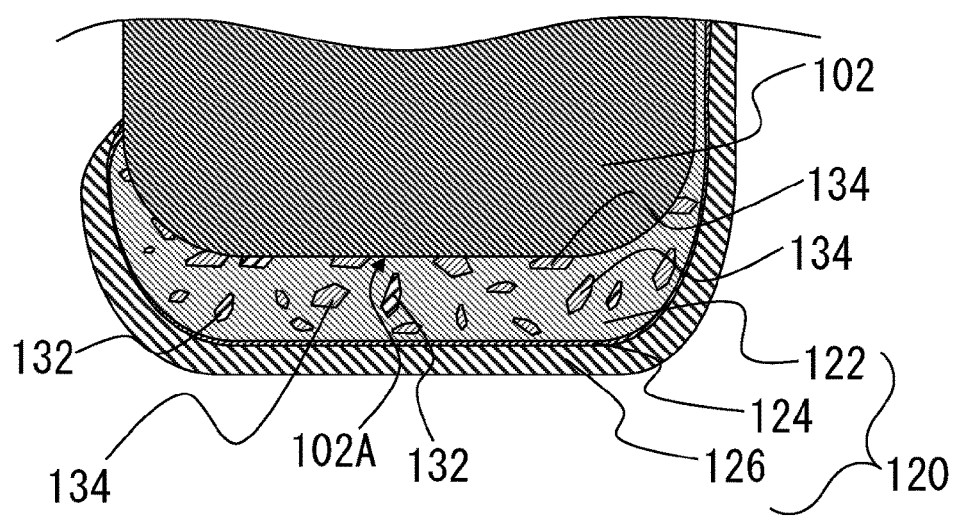
FIG. 4 is an enlarged sectional view of a part around an electrode of an inductor according to the related art.

FIG. 4 is an enlarged sectional view of a part around an electrode of an inductor according to the related art. The electrode structure of an inductor core member illustrated in FIG. 4 includes a metallized layer 122 (which corresponds to the first metal layer 22) that is commonly used and contains silver (Ag) as a main component; a nickel plating layer 124 (which corresponds to the second metal layer 24) that is disposed on the metallized layer 122 and contains nickel (Ni) as a main component; and a tin plating layer 126 (which corresponds to the third metal layer 26) that is disposed on the nickel plating layer 124 and contains tin (Sn) as a main component. The nickel plating layer 124 is formed by an electrolytic plating process, such as a barrel process. When the electrode is formed by an electrolytic plating process, the glass component contained in the metallized layer 122 is eroded by an electrolytic plating solution, and nickel enters the eroded portions. In this case, the metallized layer 122 contains a larger amount of nickel dispersion portions 134, which contain nickel as a main component, than glass dispersion portions 132, which contain glass as a main component.

Nickel has a Young's modulus of about 200 ($\times 10^9$ N/m$^2$), and is more rigid than silver or glass. Therefore, when a large amount of nickel dispersion portions 134 is contained in the metallized layer 122 as in the inductor core member according to the related art, the electrode 120 cannot be easily deformed and cannot absorb stress because of the nickel dispersion portions 134. As a result, the electrode 120 is easily damaged by an external force. When the nickel dispersion portions 134 are dispersed to a bottom surface 102A of a leg portion 102 as a result of the entrance of nickel, the joining area between the metallized layer 122 and the bottom surface 102A is reduced in the regions where the nickel dispersion portions 134 are present. Accordingly, separation of the metallized layer 122 from the bottom surface 102A, which leads to separation of the electrode 120, easily occurs. In recent years, inductors have been reduced in size and the area of the electrode 120 and the thickness of the metallized layer 122 of the electrode 120 have been reduced accordingly. As a result, the above-described problem has become more serious.

In contrast, in the electrode 20 of the inductor member 1 according to the present embodiment, as described above, a larger amount of granular first dispersion portions 32, which contain glass as a main component, than second dispersion portions 34, which contain nickel as a main component, is dispersed in the first metal layer 22, which contains silver as a main component. Therefore, the electrode 20 is less likely to be damaged, for example, cracked, by an external force than the electrode 120 according to the related art that contains a relatively large amount of nickel.

In the electronic component (inductor core member 1) according to the present embodiment, the area of the second metal layer 24 is larger than the sum of the area of the first dispersion portions 32 and the area of the second dispersion portions 34 in the sectional view. As described above, in the inductor according to the related art, a large amount of nickel enters the metallized layer 122 during the electrolytic plating process. Therefore, the area of the nickel plating layer 124 tends to be relatively small in a sectional view, and is often smaller than, for example, the sum of the area of the first dispersion portions 32 and the area of the second dispersion portions 34. In the electronic component (inductor member 1) according to the present embodiment, even when the amount of nickel is substantially the same as that in the related art, the area of the second metal layer 24 in a sectional view is relatively large, and is larger than, for example, the sum of the area of the first dispersion portions 32 and the area of the second dispersion portions 34. Since the second metal layer 24 contains a relatively large amount of nickel, separation of the third metal layer 26, for example, is suppressed. Nickel, which is the main component of the second metal layer 24, has a relatively high rigidity. Since the second metal layer 24 contains a relatively large amount of nickel, the external force applied to the joining portion between the first metal layer 22 and the bottom surface 2A is reduced.

The areas of the second metal layer 24, the first dispersion portions 32, the second dispersion portions 34, etc., can be more precisely determined by the following method. First, a mirror surface obtained by polishing a cross section of the inductor member 1 of the electronic component (inductor 10) with diamond abrasive particles is observed by an electron microscope at a magnification of 700×, and an image thereof is obtained by a CCD camera so that the area of the image is, for example, 0.028 mm$^2$ (0.184 mm in a lateral direction and 0.153 mm in a longitudinal direction). The area of each component can be determined by performing particle analysis on the obtained image by using an image analysis software "A-zou kun" (registered trademark, available from Asahi Kasei Engineering Corporation). The conditions of the particle analysis are set, for example, as follows: the brightness is set to dark, the binarization method is set to manual, and the threshold, which is an index that indicates whether an image is bright or dark, is set so that portions indicating the first dispersion portions 32 and the second dispersion portions 34 in the image are in the same color. For example, the threshold is set to 1.22 times the peak value of the histogram of brightness at each point (each pixel), for example, to 205. The small graphic removal area is set to 0 μm when the areas of the first dispersion portions 32 and the second dispersion portions 34 are determined. When the area of the second metal layer 24 is determined, the small graphic removal area is set to 0.2 μm so that the first dispersion portions 32 and the second dispersion portions 34 are treated as noise and are not subjected to the analysis.

The first dispersion portions 32 and the second dispersion portions 34 may be distinguished from each other by linear separation, elimination, etc., which are binary image correction methods. The area of the second metal layer 24 determined as a result of the above-described particle analysis by measuring the above-described image is, for example, 150 μm$^2$ or more and 225 μm$^2$ or less. The area of the second dispersion portions 34 is, for example, less than 10 μm$^2$ (but not 0 μm$^2$), and the area of the first dispersion portions 32 is, for example, 10 μm$^2$ or more and 50 μm$^2$ or less.

The second metal layer 24 containing nickel as a main component has a lower thermal conductivity and larger thermal capacity than silver. By increasing the thickness of the second metal layer 24, the transmission of heat from the mounting substrate toward the base 4 during solder reflow can be effectively suppressed.

The thermal conductivity of glass is about 0.55 to 0.75 (w/m·K), which is considerably lower than the thermal conductivity of silver, which is about 430 (w/m·K). The specific heat of glass is about 0.75 (kJ/kg/K), which is higher than the specific heat of silver, which is about 0.2 (kJ/kg/K). Thus, glass more easily stores heat than silver. During solder reflow performed to mount the inductor 10 on a circuit board or the like, a large amount of heat is transmitted from the third metal layer 26, which is at the surface of the front electrode 20, toward the leg portion 2 of the base 4. In the present embodiment, a relatively large amount of first dispersion portions 32, which contain glass as a main component, is dispersed in the first metal layer 22. Accordingly, the first dispersion portions 32, which have a smaller thermal conductivity and larger thermal capacity than both silver and nickel, suppress the transmission of heat, and store a relatively large amount of heat. After the solder reflow, the heat stored in the first dispersion portions 32 is gradually dissipated from the surface of the electrode 20. Therefore, an excessive increase in the temperature of the leg portion 2 is suppressed. Thus, in the present embodiment, an increase in the temperature of the base 4 including the leg portion 2, the increase being due to the transmission of heat generated during solder reflow to the leg portion 2, is suppressed. When the base portion 4, which includes the leg portion 2, is increased in temperature, there is a risk that, for example, the characteristics of the ferrite material will be degraded, and the magnetic permeability and the Q-value of the inductor will be reduced. In the present embodiment, the degradation of the characteristics of the electronic component (inductor 10) is suppressed.

In the electronic component (inductor 10) according to the present embodiment, at least one of the first dispersion portions 32 is in contact with the bottom surface 2A of the base portion 4. The first dispersion portions 32, which contain glass as a main component, are relatively strongly joined to the base portion 4 when they come into contact with the base portion 4. The joining strength between the first dispersion portions 32, which contain glass as a main component, and the base portion 4, which contains a ceramic as a main component, is greater than the joining strength between silver and the base portion 4. Since at least one of the first dispersion portions 32 is in contact with the base portion 4, the first metal layer 22, in which the first dispersion portions 32 are dispersed, is strongly joined to the base portion 4. This also applies to the inductor core member 1 according to the present embodiment.

In the electronic component (inductor 10) according to the present embodiment, at least one of the second dispersion portions 34 may also be in contact with the bottom surface 2A of the base 4. In this case, the area of the contact regions between the first dispersion portions 32 and the base portion 4 is larger than the area of the contact regions between the second dispersion portions 34 and the base portion 4. The joining strength between the first dispersion portions 32, which contain glass as a main component, and the base portion 4, which contains a ceramic as a main component, is greater than the joining strength between the second dispersion portions 34, which contain nickel as a main component, and the base portion 4. Accordingly, when the area of the contact regions between the first dispersion portions 32 and the base portion 4 is larger than the area of the contact regions between the second dispersion portions 34 and the base portion 4, the joining strength between the first metal layer 22 and the base portion 4 is further increased. This also applies to the inductor core member 1 according to the present embodiment.

The areas of the contact regions may be compared based on an observation image obtained by observing a cross section of the inductor core member 1 of the electronic component (inductor 10) with, for example, a scanning electron microscope. More specifically, in this observation image of the cross section, the length of the contact surface (cross section line of the contact surface) between each first dispersion portion 32 and the base portion 4 is measured, and the sum of the measured lengths is calculated. Similarly, the length of the contact surface (cross section line of the contact surface) between each second dispersion portion 34 and the base portion 4 is measured, and the sum of the measured lengths is calculated. The sum for the first dispersion portions 32 and the sum for the second dispersion portions 34 are compared, and either the first dispersion portions 32 or the second dispersion portions 34 that have the greater sum are determined to have the contact regions with the larger area.

The electronic component is not limited to the above-described inductor 10, and may instead be various other electronic components, such as a resistor, a capacitor, or a varistor. The type of the electronic component is not particularly limited. When, for example, the electronic component is a ceramic chip capacitor, the body portion 30 includes dielectric ceramic layers and inner electrode layers that are alternately arranged. The dielectric ceramic layers contain barium titanate as a main component. The inner electrode layers contain a metal, such as silver, as a main component. The first metal layer 22 of the electrode 20 is electrically connected to the inner electrode layers, which are exposed at an end surface of the body portion 30, which has a rectangular parallelepiped shape. When the electronic component is a chip resistor, the body portion 30 is, for example, a plate-shaped substrate containing alumina, for example, as a main component. The electrode 20 is disposed on each end portion of the substrate such that the electrode 20 extends from the top surface to the bottom surface of the end portion. The chip resistor includes a resistor disposed between the electrodes 20.

An example of a method for manufacturing the inductor core member 1 will now be described.

First, a mold is filled with ceramic powder, such as alumina powder or ferrite material powder. The ceramic powder is formed into a ceramic compact by pressure molding, and the ceramic compact is fired at a predetermined firing temperature to obtain the base portion 4 including the winding portion 3 and the leg portions 2. The base portion 4 is preferably subjected to a barrel process so that burrs or the like formed in the molding process are removed. The barrel process is preferably performed by placing at least water and the base 4, which serves as a product, in a centrifugal barrel device.

Next, the first metal layer 22 is formed on the surface of the base 4. Silver paste, which is the mixture of silver (Ag), glass powder, and binder and which serves as the material of the first metal layer 22, is prepared. The silver paste contains 70 to 75 mass % of silver (Ag), 1 to 5 mass % of glass powder, and 20 to 29 mass % of binder. The average particle diameter of the glass powder is about 3 to 5 µm. The silver paste is applied to the bottom surface 2A of each leg portion 2. At this time, the silver paste spreads over the entirety of the bottom surface 2A of each leg portion 2 and over a portion of the outer side surface 2b of each leg portion 2. The entirety of the base 4 to which the silver paste is applied is heated to about 500 to 700 degrees so that the silver paste is sintered. Thus, a metallized layer containing silver as a main component, that is, the first metal layer 22, is formed on the surface of the base 4. A relatively large amount of glass is dispersed in the metallized layer, which contains silver as a main component. More specifically, the first dispersion portions 32, which contain glass as a main component, are dispersed in the first metal layer 22.

The surface of the metallized layer is subjected to an electrolytic nickel plating process. More specifically, the second metal layer 24 containing nickel as a main component is formed on the first metal layer 22. The electrolytic nickel plating process may be performed by using a so-called barrel plating device. Barrel plating is also called rotary plating. Products are placed in a barrel surrounded by an exterior wall in which multiple thin through holes are formed, and are immersed in a plating solution. The products to be plated are brought into contact with a plating electrode a plurality of times while the barrel is rotated, and are plated when they come into contact with the plating electrode. The plating solution used in the electrolytic nickel plating process dissolves glass dispersed in the metallized layer. Therefore, when the electrolytic nickel plating process is performed under normal conditions, a large amount of the glass contained in the metallized layer is dissolved and nickel relatively easily enters the metallized layer. The nickel that has entered forms the second dispersion portions containing nickel as a main component. Thus, the first metal layer 22 includes the second dispersion portions containing nickel as a main component. In the present embodiment, the rotational speed of the barrel and the voltage applied in the electrolytic plating process are adjusted so that a relatively thick nickel plating layer, that is, the second metal layer 24, is formed over the entire surface of the metallized layer while the degree of dissolution of the glass dispersed in the metallized layer is relatively low. For example, in an early stage of the electrolytic plating process, the rotational speed of the barrel is set to a low speed and the voltage is set to a relatively high voltage. Thus, the conditions are adjusted so that the time for which the products remain in contact with the plating electrode per contact is relatively long and a relatively thick nickel plating layer is formed in a short time. After a certain time has elapsed, the rotational speed of the barrel is increased and the voltage is reduced, so that the time for which the products remain in contact with the plating electrode per contact is reduced while the number of times the products come into contact with the plating electrode is increased, and the thickness of the film formed each time the products come into contact with the plating electrode is reduced. Thus, the statistical variations are reduced. Accordingly, variations in the thickness of the nickel plating layer between the products are reduced, and the uniformity of the thickness of the nickel plating layer on each product is increased. When, for example, the conditions of barrel plating are adjusted as described above, a nickel plating layer having a sufficient thickness to prevent the entrance of the plating solution can be formed in an early stage of the plating process before the dissolution of the glass in the metallized layer progresses, and variations in the final film thickness can be reduced. Therefore, a large amount of glass remains in the metallized layer. In addition, the amount of nickel that is dispersed is small, and the nickel plating layer is relatively thick. More specifically, in a cross section of the first metal layer 22, which contains silver as a main component, the area of the first dispersion portions 32, which contain glass as a main component, is larger than the area of the second dispersion portions 34, which contain nickel as a main component. In addition, the area of the second metal layer 24 is larger than the sum of the area of the first dispersion portions 32 and the area of the second dispersion portions 34.

As described above, in the electrolytic nickel plating process, the second dispersion portions 34 are formed as the glass in the metallized layer is replaced by nickel. Therefore, in the metallized layer, the glass in the region near the surface of the metallized layer, that is, the region near the nickel plating layer, is more easily dissolved than the glass in the region near the bottom surface 2A. Accordingly, in the electronic component and the inductor member 1 according to the present embodiment, the area of the first dispersion portions 32 in cross section is larger in the region near the bottom surface 2A than in the region near the second metal layer 24. In addition, the area of the second dispersion portions 34 in cross section is larger in the region near the second metal layer 24 than in the region near the bottom surface 2A.

After the nickel electrolytic plating process, a tin plating layer containing tin as a main component is formed by plating the surface of the nickel plating layer with tin by an electrolytic plating process. More specifically, the third metal layer 26 is formed on the second metal layer 24, which contains nickel as a main component. Thus, each electrode 20 includes the first metal layer 22, the second metal layer 24, and the third metal layer 26. The first metal layer 22 contains silver (Ag) as a main component and includes the first dispersion portions 32, which contain glass as a main component, and the second dispersion portions 34, which contain nickel as a main component. The second metal layer 24 is disposed on the first metal layer 22 and contains nickel (Ni) as a main component. The third metal layer 26 is disposed on the second metal layer 24 and contains tin (Sn) as a main component. As described above, the inductor core member 1 according to the present embodiment includes the base portion 4 and the electrodes 20 disposed on the base portion 4. Each electrode 20 includes the first metal layer 22, the second metal layer 24, and the third metal layer 26. The first metal layer 22 contains silver (Ag) as a main component and includes the first dispersion portions 32, which contain glass as a main component, and the second dispersion portions 34, which contain nickel as a main component. The second metal layer 24 is disposed on the first metal layer 22 and contains nickel (Ni) as a main component. The third metal layer 26 is disposed on the second metal layer 24 and contains tin (Sn) as a main component. The area of the first dispersion portions 32 is larger than the area of the second dispersion portions 34 in a sectional view of each electrode 20.

The inductor 10 according to the present embodiment can be manufactured by winding the wire 5 around the winding portion 3 of the inductor core member 1 that is manufactured by the above-described method, and securing the wire 5. The wire 5 is made of copper and has a diameter of about 20 μm to 30 μm. The wire 5 is wound six or seven turns around the winding portion 3 of the inductor core member 1, and is fixed to the electrodes 20 on the leg portions 2 of the inductor core member 1 with solder or the like.

Although embodiments and examples of the present invention have been described, the present invention is not limited to the above-described embodiments and examples. Various modifications and alterations are, of course, possible within the scope of the present invention.

REFERENCE SIGNS LIST 1 inductor core member
2 leg portion
2A bottom surface
2a inner side surface
2b outer side surface
2α, 2β cross section line
3 winding portion
4 base portion
5 wire
10 inductor
20 electrode
22 first metal layer
24 second metal layer
26 third metal layer
30 body portion
32 first dispersion portion
34 second dispersion portion

The invention claimed is:
1. An electronic component comprising:
a body portion; and
an electrode disposed on the body portion,
wherein the electrode comprises
  a first metal layer containing silver (Ag) as a main component of the first metal layer and comprising first dispersion portions containing glass as a main component of the first dispersion portions, and second dispersion portions containing nickel (Ni) as a main component of the second dispersion portions,
  a second metal layer disposed on the first metal layer and containing nickel (Ni) as a main component of the second metal layer, and
  a third metal layer disposed on the second metal layer and containing tin (Sn) as a main component of the third metal layer, and
wherein an area of the first dispersion portions is larger than an area of the second dispersion portions in a sectional view of the electrode.
2. The electronic component according to claim 1, wherein at least one of the first dispersion portions is in contact with the body portion.
3. The electronic component according to claim 2, wherein at least one of the second dispersion portions is in contact with the body portion, and
wherein an area of a contact region between the at least one of the first dispersion portions and the body portion is larger than an area of a contact region between the at least one of the second dispersion portions and the body portion.

4. The electronic component according to claim 1, wherein an area of the second metal layer is larger than a sum of the area of the first dispersion portions and the area of the second dispersion portions in the sectional view of the electrode.

5. An inductor core member comprising:
a base portion; and
an electrode disposed on the base portion,
wherein the electrode comprises
- a first metal layer containing silver (Ag) as a main component of the first metal layer and comprising
   first dispersion portions containing glass as a main component of the first dispersion portions, and
   second dispersion portions containing nickel as a main component of the second dispersion portions,
- a second metal layer disposed on the first metal layer and containing nickel (Ni) as a main component of the second metal layer, and
- a third metal layer disposed on the second metal layer and containing tin (Sn) as a main component of the third metal layer, and wherein an area of the first dispersion portions is larger than an area of the second dispersion portions in a sectional view of the electrode.

6. The inductor core member according to claim 5, wherein the base portion comprises
a winding portion, and
a leg portion, and
wherein the electrode is disposed on a bottom surface of the leg portion.

7. An inductor comprising:
the inductor core member according to claim 6; and
a wire wound around the winding portion of the inductor core member.

8. The electronic component according to claim 1, wherein a number of the first dispersion portions increases from the first metal layer towards the body portion.

9. The electronic component according to claim 5, wherein a number of the first dispersion portions increases from the first metal layer towards the body portion.

* * * * *